(12) United States Patent
Baek et al.

(10) Patent No.: US 7,586,182 B2
(45) Date of Patent: Sep. 8, 2009

(54) PACKAGED SEMICONDUCTOR DIE AND MANUFACTURING METHOD THEREOF

(75) Inventors: Seung-Duk Baek, Gyeonggi-do (KR); Sun-Won Kang, Seoul (KR); Sang-Wook Park, Gyeonggi-do (KR); Dong-Ho Lee, Gyeonggi-do (KR); Jong-Joo Lee, Gyeonggi-do (KR)

(73) Assignee: Samsung Electronics Co., Ltd., Suwon-si, Gyeongg-do (KR)

( * ) Notice: Subject to any disclaimer, the term of this patent is extended or adjusted under 35 U.S.C. 154(b) by 249 days.

(21) Appl. No.: 11/289,665

(22) Filed: Nov. 28, 2005

(65) Prior Publication Data

US 2006/0134833 A1 Jun. 22, 2006

(30) Foreign Application Priority Data

Nov. 26, 2004 (KR) .................. 10-2004-0098008

(51) Int. Cl.
*H01L 23/48* (2006.01)
*H01L 23/52* (2006.01)

(52) U.S. Cl. .................. 257/686; 257/777; 257/787; 257/780; 257/E23.063

(58) Field of Classification Search .................. 257/787, 257/784, 780, 686, 777, E23.063
See application file for complete search history.

(56) References Cited

U.S. PATENT DOCUMENTS

| | | | | |
|---|---|---|---|---|
| 5,956,233 A | * | 9/1999 | Yew et al. | 361/760 |
| 6,049,129 A | * | 4/2000 | Yew et al. | 257/737 |
| 6,060,768 A | * | 5/2000 | Hayashida et al. | 257/666 |
| 6,144,102 A | * | 11/2000 | Amagai | 257/781 |
| 6,188,127 B1 | * | 2/2001 | Senba et al. | 257/686 |
| 6,455,928 B2 | * | 9/2002 | Corisis et al. | 257/686 |
| 6,686,656 B1 | * | 2/2004 | Koh et al. | 257/686 |
| 7,138,724 B2 | * | 11/2006 | Grigg et al. | 257/782 |
| 2003/0094704 A1 | | 5/2003 | Gann | |
| 2003/0178716 A1 | * | 9/2003 | Maeda et al. | 257/686 |
| 2004/0175916 A1 | * | 9/2004 | Shin et al. | 438/613 |
| 2004/0188819 A1 | * | 9/2004 | Farnworth et al. | 257/686 |

FOREIGN PATENT DOCUMENTS

| | | |
|---|---|---|
| JP | 11-297876 | 10/1999 |
| KR | 0169820 | 10/1998 |
| KR | 2002-0046776 | 6/2002 |

OTHER PUBLICATIONS

English language abstract of Korean Publication 2002-0046776.
English language abstract of Japanêse Publication 11-297876.

* cited by examiner

*Primary Examiner*—Nitin Parekh
(74) *Attorney, Agent, or Firm*—Marger Johnson & McCollom, P.C.

(57) ABSTRACT

Aspects of the subject matter described herein relate to a packaged semiconductor die which becomes a component of a finished multi-chip package. The packaged semiconductor die comprises a die substrate, a semiconductor package, and a sealant. The die substrate includes an insulating substrate and a circuit pattern formed on the insulating substrate. The semiconductor package has a semiconductor chip electrically coupled to the circuit pattern that is a known good package and is coupled to the die substrate. The sealant seals the semiconductor package. The packaged semiconductor die utilizes a known good package which has passed a series of package tests.

20 Claims, 7 Drawing Sheets

PACKAGED SEMICONDUCTOR DIE AND MANUFACTURING METHOD THEREOF

CROSS REFERENCE TO RELATED APPLICATIONS

This application claims the priority of Korean Patent Application No. 2004-98008, filed on Nov. 26, 2004, in the Korean Intellectual Property Office, the disclosure of which is incorporated herein in its entirety by reference.

BACKGROUND OF THE INVENTION

1. Field of the Invention

The present invention relates generally to a semiconductor device and, more particularly, to a packaged semiconductor die that becomes a component of a finished multi-chip package, and a manufacturing method thereof.

2. Description of the Related Art

In the electronics industry are continuous demands for improvements of semiconductor products, such as, for example component weight reduction, component miniaturization, increased speed, multi-function abilities, increased performance, higher reliability, and lower costs. Assembly technology of a semiconductor package is one of many important technologies that enable satisfaction of a composite demand including miniaturization, multi-function, and high performance. A multi-chip package (MCP) is one of the recently developed package types to meet the composite demand. The multi-chip package stacks two or more semiconductor chips vertically on a substrate, thereby greatly reducing the area that the semiconductor chips occupy in a finished product set. Consequently, the multi-chip package contributes to an increase in the number of semiconductor chips per unit area.

SIP (System-In-a-Package) technology attempts to assemble, in a package, all semiconductor chips needed for a given unit system. SOC (System-On-a-Chip) technology attempts to integrate within a semiconductor chip all functions needed for a given unit system. SIP technology may be viewed as an intermediate technology between MCP and SOC technologies. Additionally, SIP technology is a key technology for communications modules implementing RF wireless communications, Bluetooth standard (a local area network protocol), high performance personal computer (PC) cards, and cellular phones.

In the case that a bare chip cut from a semiconductor wafer is utilized for a multi-chip package (MCP) including a SIP, a good finished multi-chip package (MCP) requires a precondition that the bare chip is a known good die (KGD—an unpackaged die that has passed a designated series of electrical and burn-in tests and is not shown to be defective so as to be mounted on a multi-chip package). It is difficult to test a bare chip, which does not have a protective means to resist external electrical and mechanical shocks. Because a designated series of tests are performed on a bare chip, a problem exists in that obtaining a known good die is difficult. Consequently, the use of a semiconductor die, which packages a bare chip and protects the bare chip from external electrical and mechanical shocks, has been suggested in testing the bare chip. A good packaged die having successfully passed a designated series of tests may be utilized as a component of a semiconductor package.

FIG. 1 is a sectional view showing a conventional packaged semiconductor die. As shown in FIG. 1, a packaged semiconductor die 100 comprises a die substrate 120, a semiconductor chip 110, wire 160, and a sealant 170.

The die substrate 120 comprises an insulating substrate 121 of a platy form and having an upper surface and a lower surface, a substrate pad 122 formed on the lower surface of the insulating substrate 121, and a signal pad 123 and test pad 124 both formed on the upper surface of the insulating substrate 121. The signal pad 123 may be connected to a wire or bump for external connection. The test pad 124 may act as an external interface terminal for testing the packaged semiconductor die 100.

The semiconductor chip 110 is attached to the lower surface of the die substrate 120, and comprises a chip substrate 111, a chip pad 112 formed on the chip substrate 111, and a passivation layer 113 stacked on the chip substrate 111 so as to expose the chip pad 112.

The substrate pad 122 and chip pad 112 are electrically connected with wire 160, which is commonly made of gold (Au).

The sealant 170 seals the semiconductor chip 110 and wire 160 as shown in FIG. 1, and protects them from external electrical and mechanical shocks. In one embodiment, the sealant 170 is made of epoxy resin.

However, a finished semiconductor package that has been verified to be a known, good, package may not be utilized for the conventional packaged semiconductor die. For example, a semiconductor chip, such as a bare chip as shown in FIG. 1, has to be packaged separately and this separate packaging may cause a problem, such as, increasing the required time and cost in manufacturing semiconductors. Additionally, in the case that a semiconductor chip is tested in a packaged semiconductor die of a land grid array (LGA) type as shown in FIG. 1, the test pad 124 may be easily broken by a test contact pin (not shown) thereby disrupting the test process. Furthermore, a test failure after packaging a semiconductor die may cause not only the waste of effort invested in packaging, but also the reduction of efficiency in manufacturing semiconductors.

Accordingly, the object of the present invention is to provide an improved packaged semiconductor die and its manufacturing method which may be utilized for various existing semiconductor package types.

SUMMARY OF THE INVENTION

According to one embodiment of the present invention, a method of manufacturing a packaged semiconductor die includes providing a die substrate having an insulating substrate and a circuit pattern formed on the insulating substrate, mounting the die substrate on a semiconductor package that has been verified to be a known good package based on the package having passed designated tests and electrically connecting the semiconductor package with the circuit pattern, and sealing the semiconductor package with a sealant.

According to another embodiment of the present invention, a packaged semiconductor die includes a die substrate having an insulating substrate and a circuit pattern formed on the insulating substrate, a semiconductor package that has been verified to be a known good package based on the package having passed designated tests is mounted on the die substrate and has a semiconductor chip electrically connected with the circuit pattern, and a sealant sealing the semiconductor package.

DETAILED DESCRIPTION OF EXAMPLE EMBODIMENTS OF THE INVENTION

Hereinafter, a packaged semiconductor die and its manufacturing method according to the present invention will be described in detail with reference to the accompanying drawings. The manufacturing method of a packaged semiconductor die according to the present invention is described first.

FIGS. 2A to 2H are sectional views showing steps of the manufacturing method of a packaged semiconductor die according to the present invention.

Figure 2A:
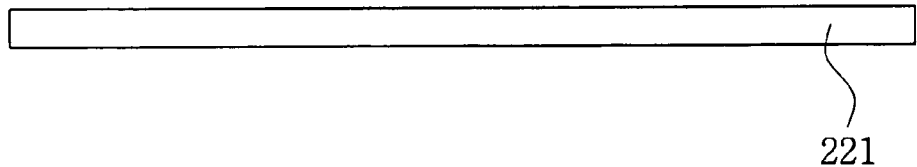
FIGS. 2A to 2H are sectional views illustrating steps of a manufacturing method of a packaged semiconductor die, according to an embodiment of the present invention.

Referring to FIG. 2A, an insulating substrate 221 of a platy form is provided. The insulating substrate 221 includes an upper and a lower surface and the insulating substrate 221 may be manufactured as a hard or as a flexible type substrate. In one embodiment, the hard type substrate may be manufactured from base resin, such as epoxy, polyester, or phenolic resin, and reinforced with cotton paper, woven glass, or mat glass. In another embodiment, the flexible type substrate may be manufactured of polyimide.

Figure 2B:
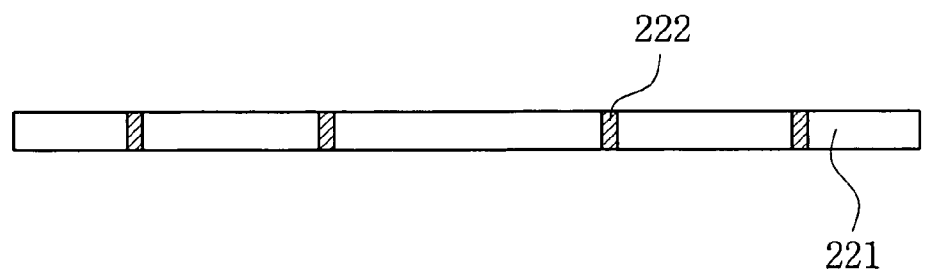

Referring to FIG. 2B, a conductive line 222 penetrating the insulating substrate 221 is formed. In one embodiment, the conductive line 222 is formed by boring a via hole through the insulating substrate 221 and then by filling the via hole with a conductive material (not shown).

Figure 2C:
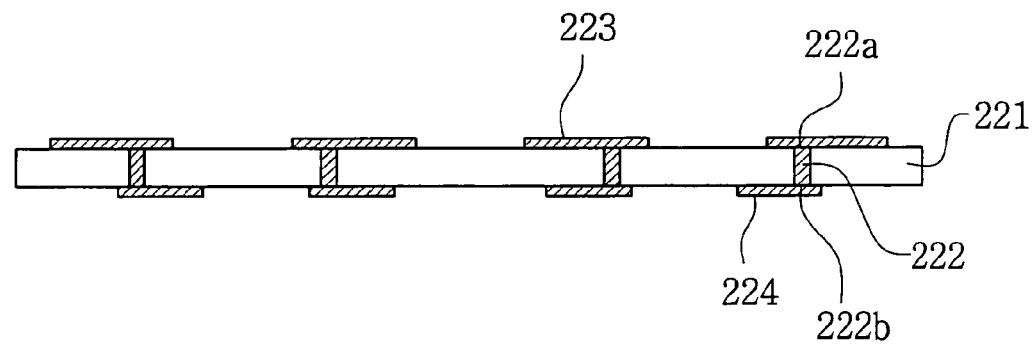

Referring to FIG. 2C, a first and second circuit pattern 223 and 224 are formed on the upper and lower surface of the insulating substrate 221 respectively. In one embodiment, the first circuit pattern 223 may be formed by depositing a thin copper film on the upper surface of the insulating substrate 221, and etching the copper film to form a desired pattern. In this embodiment, the second circuit pattern 224 may be formed similarly to the first circuit pattern 223 thereby forming the conductive line 222 that further includes end 222a and end 222b. Consequently, end 222a and end 222b of the conductive line 222 are electrically coupled with the first and second circuit pattern 223 and 224, respectively.

In one embodiment, the first and second circuit patterns 223 and 224 are formed after the formation of the conductive line 222. In another embodiment, the conductive line 222 are formed after the formation of the first and second circuit patterns 223 and 224, for example the conductive line 222 may have a shape of a circular pipe adjacent to the side wall of the via hole penetrating the insulating substrate 221.

Figure 2D:
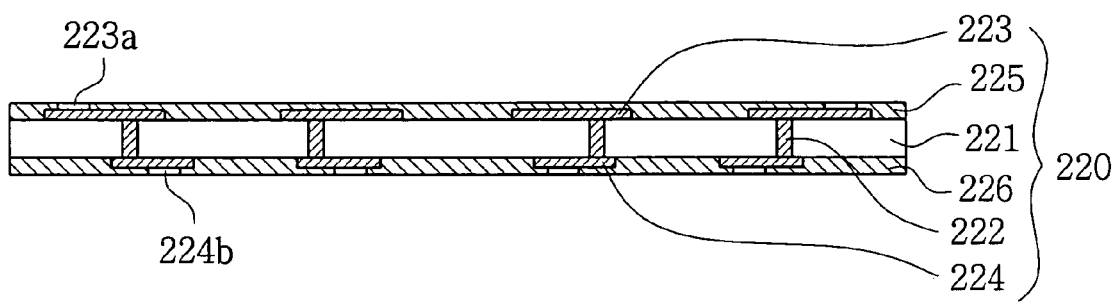

Referring to FIG. 2D, a first insulating layer 225 and second insulating layer 226 are formed on the upper and lower surface of the insulating substrate 221. Forming the first insulating layer 225 and the second insulating layer 226 defines a first substrate pad 223a and second substrate pad 224b by leaving portions of the first circuit pattern 223 and second circuit pattern 224 exposed. With this, the die substrate 220 is obtained.

Figure 2E:
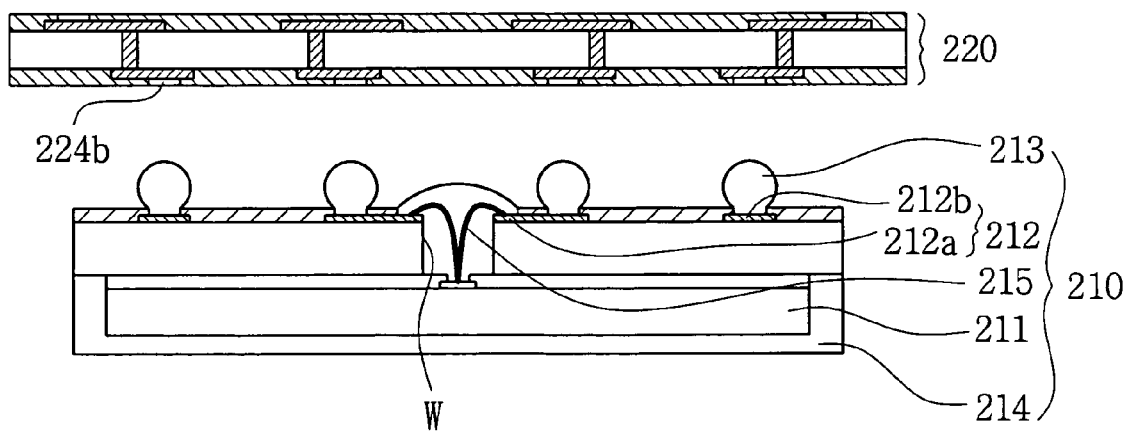

Referring to FIG. 2E, the die substrate 220 and a first semiconductor package 210 are provided. The first semiconductor package 210 is a known good package which has passed a designated series of package-level tests and has an acceptable level of reliability. The first semiconductor package 210 includes a first package substrate 212 having a window W, a first package substrate pad 212a, a first package substrate ball pad 212b, a first semiconductor chip 211 of a center-pad type stacked on the first package substrate 212, a first package wire 215 electrically coupling the first semiconductor chip 211 with the first package substrate pad 212a, a first package solder ball 213 formed on the first package substrate ball pad 212b, and a first package sealant 214 sealing the first semiconductor chip 211 and the first package wire 215. The second substrate pads 224b of the die substrate 220 correspond to the first package solder balls 213.

In one embodiment, a window ball grid array (WBGA) type package is utilized as the first semiconductor package 210. However, other types of packages may be employed as well, such as, for example including a commonly used ball grid array (BGA), which is mountable on the die substrate 220.

Figure 2F:
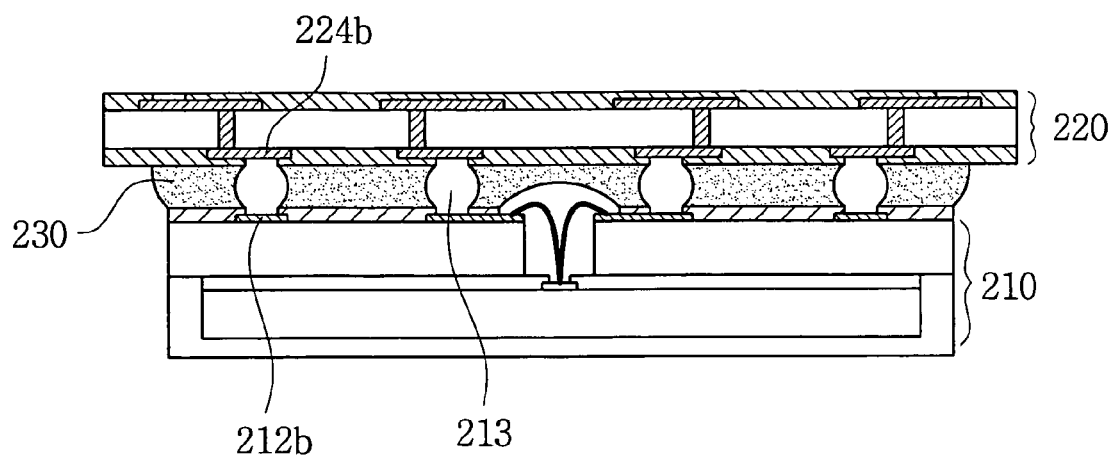

Referring to FIG. 2F, the first semiconductor package 210 is mounted on the die substrate 220. The first package solder ball 213 is attached to the second substrate pad 224b of the die substrate 220, and a filler 230 is filled within the space between the die substrate 220 and the first semiconductor package 210.

Figure 2G:
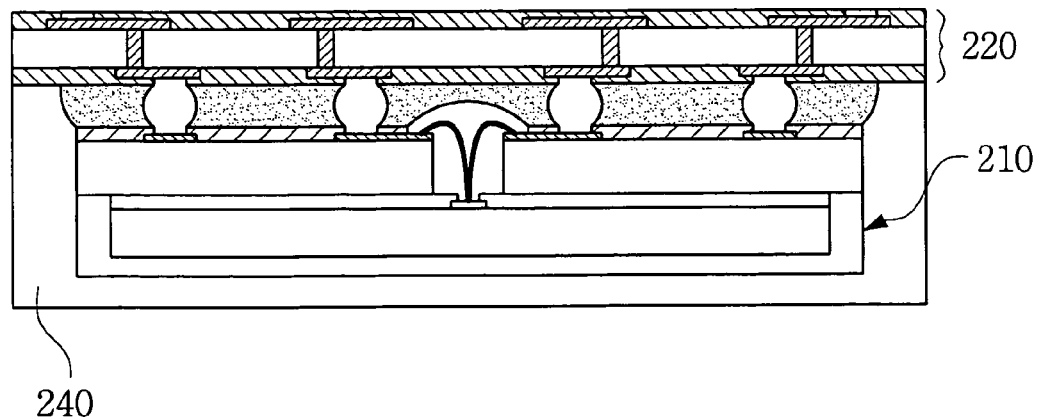

Referring to FIG. 2G, the first semiconductor package 210 and the lower surface of the die substrate 220 are sealed with a die sealant 240.

Figure 2H:
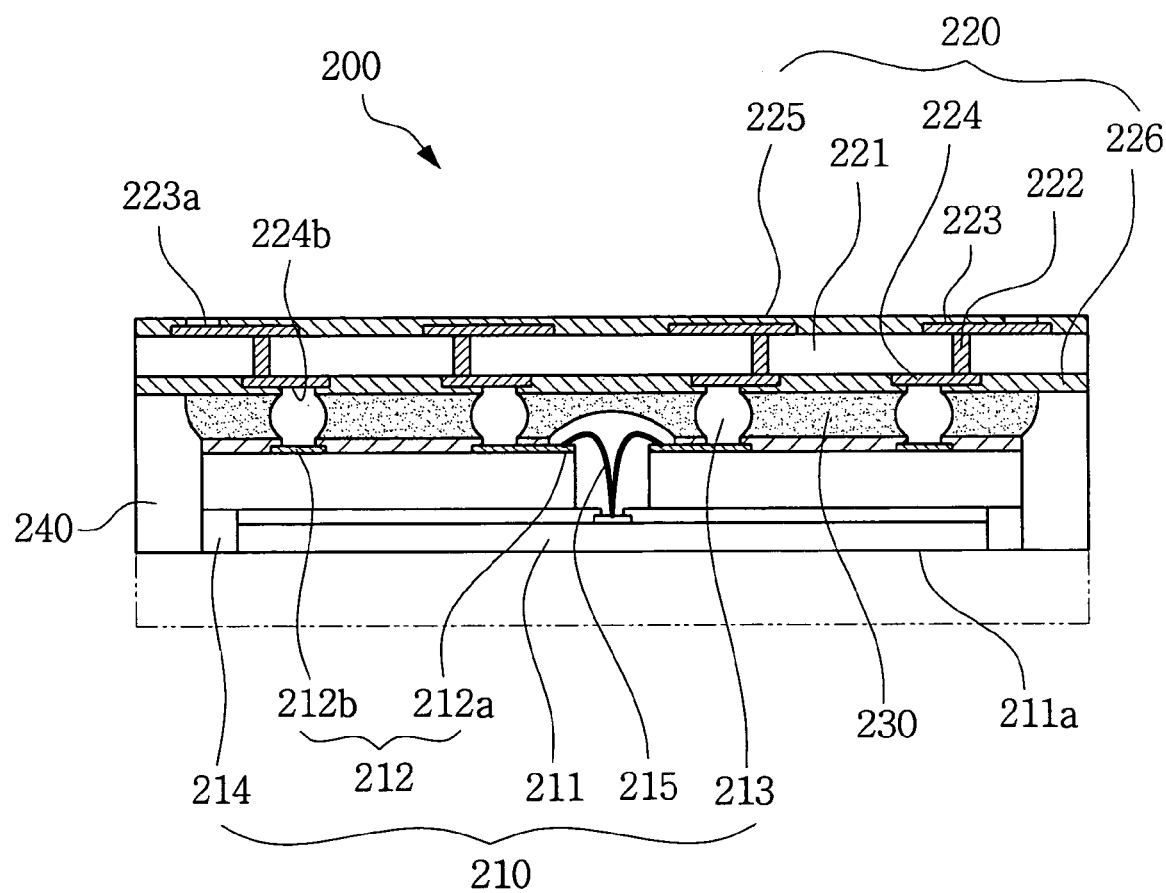

Referring to FIG. 2H, in one embodiment the thickness of the packaged semiconductor die 200 may be reduced by grinding away the die sealant 240, the first package sealant 214, and the first semiconductor package 210. In another embodiment, for a multi-chip package the utilization of the packaged semiconductor die 200, including a reduced thickness, contributes to the thinness and miniaturization of a systems product.

In addition, as shown in FIG. 2H, in one embodiment a silicon substrate surface 211a of the first semiconductor chip 211 is exposed. In this embodiment, the exposed silicon substrate surface 211a facilitates the dissipation of heat generating from the first semiconductor chip 211. Because the silicon substrate surface 211a has better adhesive properties than the die sealant 240 in general, in the case of the utilization of the packaged semiconductor die 200 for a multi-chip package, the adhesive strength between the stacked dies increases.

This completes the description of the manufacturing method of the packaged semiconductor die 200 according to the present invention.

Hereinafter, a packaged semiconductor die according to the present invention is explained with reference to FIG. 2H. As shown in FIG. 2H, the packaged semiconductor die 200 comprises a die substrate 220, a first semiconductor package 210, and a die sealant 240.

The die substrate 220 includes an insulating substrate 221 of a platy form, a first circuit pattern 223 and second circuit pattern 224 formed on the upper and lower surface of the insulating substrate 221 respectively, conductive line 222 electrically coupling the first circuit pattern 223 with the second circuit pattern 224, and a first insulating layer 225 and second insulating layer 226 formed on the upper and lower surface of the insulating substrate 221 respectively so as to expose a first substrate pad 223a and second substrate pad 224b. In the case of a multi-chip package, (described in FIGS. 3 and 4, below) the first substrate pad 223a acts as an external interface terminal. In one embodiment, it may be preferable to standardize the position and configuration of the first substrate pad 223a, an external interface pad of the die substrate 220, because a standardized first substrate pad 223a does not require an alteration to existing manufacturing processes, such as, including wire bonding for any type of multi-chip packages.

In another embodiment, the first circuit pattern 223 and second circuit pattern 224 are formed on the upper and lower surface of the insulating substrate 221, respectively. The circuit patterns may be formed on either of the upper or lower surfaces of the insulating substrate 221. In this embodiment, all substrate pads for external interfaces may be placed on the same plane.

The first semiconductor package 210, which is a known good package due to it having passed a series of package tests, is mounted on the die substrate 220. The first semiconductor chip 211 is electrically coupled with the die substrate 220 through contact between a first package solder ball 213 of the first semiconductor package 210 and a second substrate pad 224b of the die substrate 220. A filler 230 is filled within the space between the die substrate 220 and the first semiconductor package 210. Each element of the first semiconductor package 210 was described above in relation to FIG. 2E, and therefore is not duplicated here.

A die sealant 240 seals the side surfaces of the first semiconductor package 210 and the lower surface of the die substrate 220. A silicon substrate surface 211a of the first semiconductor chip 211 is exposed outwardly, as the die sealant 240 and the first semiconductor package 210 were ground away as described above.

Figure 1:
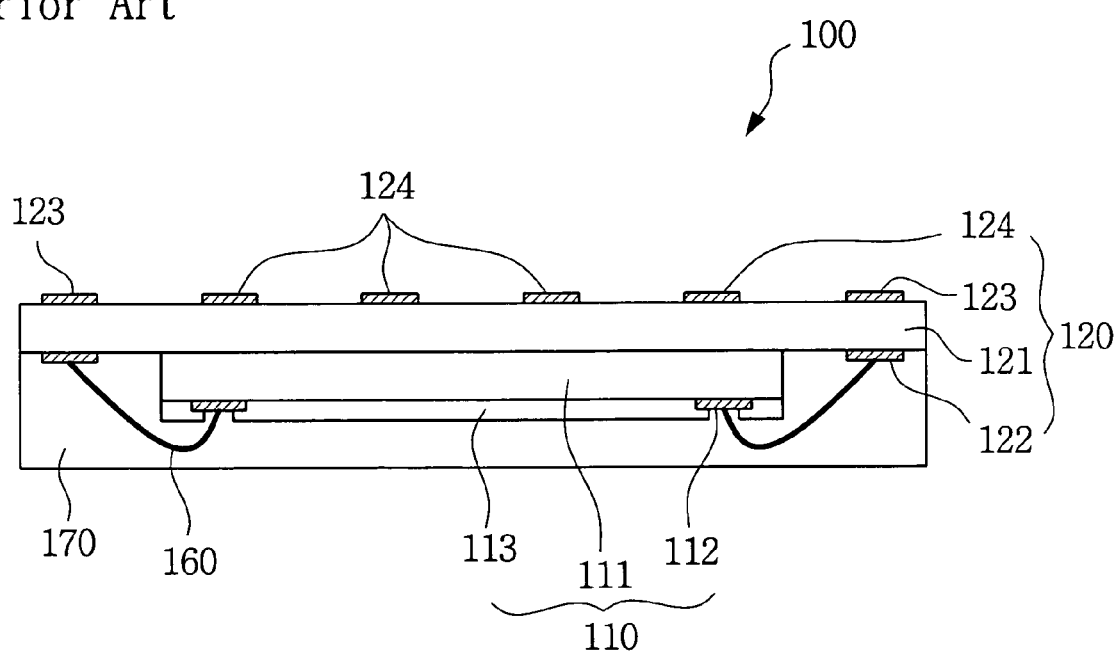
FIG. 1 is a sectional view illustrating a conventional packaged semiconductor die.

Because the packaged semiconductor die 200 utilizes, as the first semiconductor package 210, a known good package which has passed a series of package tests, the packaged semiconductor die 200 itself may become another known good package usable for a multi-chip package, such as a SIP. Consequently, the packaged semiconductor die 200 may have advantages in comparison with the conventional packaged semiconductor die 100, shown in FIG. 1, which utilizes a bare semiconductor chip 110 whose quality is, as yet, unknown. Therefore, a manufacturing process for the packaged semiconductor die 200 may have a higher yield. Additionally, the packaged semiconductor die 200 may provide better applicability and design flexibility for a multi-chip package, such as a SIP.

Hereinafter, for a multi-chip package type, utilization of the packaged semiconductor die according to the present invention is explained.

Figure 3:
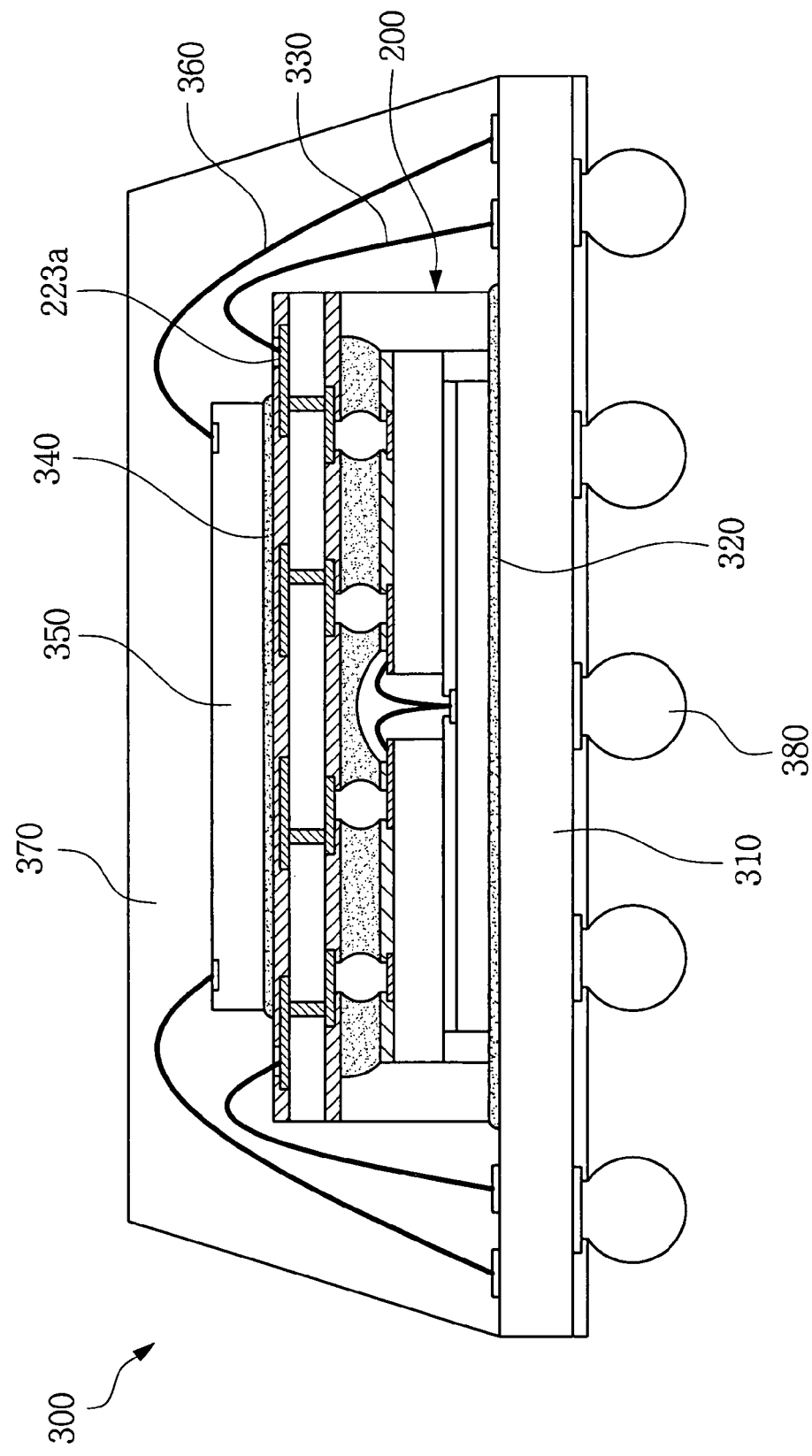
FIG. 3 is a sectional view illustrating an example embodiment of a multi-chip package utilizing the packaged semiconductor die, in accordance with the present invention.

FIG. 3 is a sectional view illustrating an example embodiment of a multi-chip package utilizing the packaged semiconductor die, in accordance with the present invention. As shown in FIG. 3, a first multi-chip package 300 includes a first substrate 310, a packaged semiconductor die 200, first wire 330, a second semiconductor chip 350, second wire 360, a first sealant 370, and a first solder ball 380. FIG. 3 may include additional unnumbered components not relevant to the present discussion.

The packaged semiconductor die 200 is adhered to a first adhesive layer 320 so as to be stacked on the first substrate 310. A first substrate pad 223a of the packaged semiconductor die 200 is electrically coupled to the first substrate 310 via the first wire 330. The second semiconductor chip 350 is adhered to a second adhesive layer 340 so as to be stacked on the packaged semiconductor die 200, and is electrically coupled to the first substrate 310 via the second wire 360. The first sealant 370 seals the packaged semiconductor die 200, the first wire 330, the second semiconductor chip 350, and the second wire 360. The first solder ball 380 is formed on the lower surface of the first substrate 310 and acts as an external interface terminal of the first multi-chip package 300, such as, for example to provide power to the first multi-chip package 300, to apply the functionality of the first multi-chip package 300, and this like.

Figure 4:
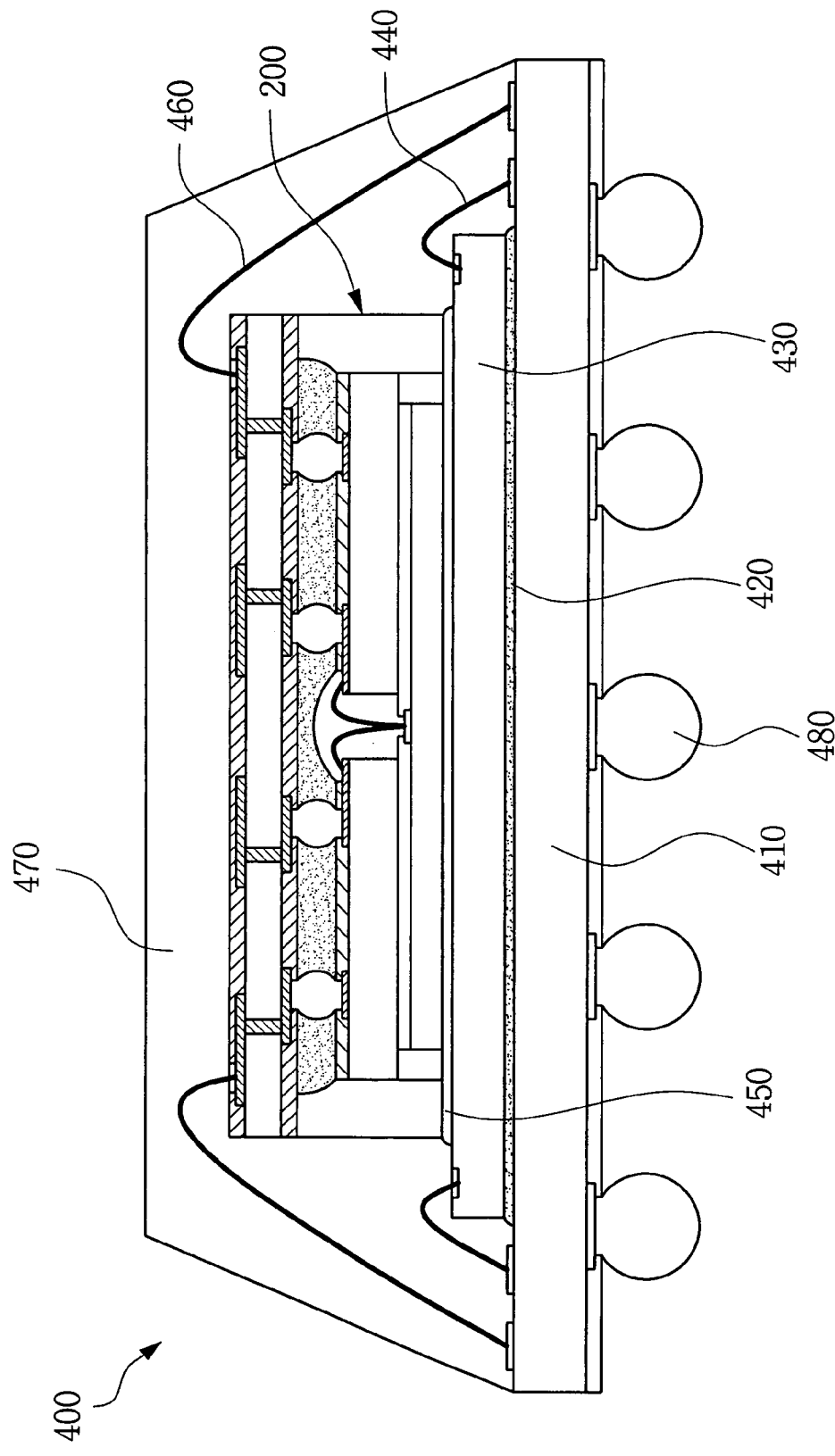
FIG. 4 is a sectional view showing another example embodiment of a multi-chip package utilizing the packaged semiconductor die, in accordance with the present invention.

FIG. 4 is a sectional view illustrating another example embodiment of a multi-chip package utilizing the packaged semiconductor die, in accordance with the present invention. As shown in FIG. 4, a second multi-chip package 400 includes a second substrate 410, a third semiconductor chip 430, third wire 440, a packaged semiconductor die 200, fourth wire 460, a second sealant 470, and a second solder ball 480. In one embodiment, the second sealant 470 and the second solder ball 480 are substantially similar to the first sealant 370 and the first solder ball 380 in FIG. 3, respectively, and therefore are not described here. FIG. 4 may include additional unnumbered components not relevant to the present discussion.

The third semiconductor chip 430 is adhered to a third adhesive layer 420 so as to be stacked on the second substrate 410, and is electrically coupled to the second substrate 410 via third wire 440. The packaged semiconductor die 200 is adhered to a fourth adhesive layer 450 so as to be stacked on the third semiconductor chip 430, and is electrically coupled to the second substrate 410 via fourth wire 460.

In the above descriptions of example embodiments, the multi-chip packages have only two dies stacked on their substrates. In other embodiment, the packaged semiconductor die may also be utilized for a multi-chip package that has more than two dies stacked therein.

The packaged semiconductor die according to the present invention utilizes a known good package which has passed a series of package tests, thereby leading to a higher yield in comparison with the related arts which utilize a bare chip whose quality is not yet known. In addition, the packaged semiconductor die according to the present invention itself may become another known good package, thereby providing better applicability and design flexibility for a multi-chip package such as an SIP.

While example embodiments of the invention have been shown and described in this specification, it will be understood by those skilled in the art that various changes or modifications of the embodiments are possible without departing from the spirit of the invention as defined by the appended claims.

What is claimed is:

1. A packaged semiconductor die comprising:
   a die substrate that includes an insulating substrate and a circuit pattern formed on the insulating substrate;
   a semiconductor package that includes a package substrate and a first semiconductor chip disposed on the package substrate, wherein the first semiconductor chip is electrically coupled to the circuit pattern, wherein the semiconductor package is a known good package and coupled to the die substrate;
   a solder ball disposed between the die substrate and the semiconductor package; and
   a first sealant sealing the semiconductor package,
   wherein the package substrate is spaced apart from the die substrate,
   wherein the first semiconductor chip is electrically coupled to the circuit pattern via the solder ball, and
   wherein the solder ball is in contact with the circuit pattern directly.

2. The packaged semiconductor die of claim 1, wherein the insulating substrate includes an upper surface and lower surface, and the circuit pattern comprises a first circuit pattern and a second circuit pattern formed on the upper and lower surface of the insulating substrate, respectively.

3. The packaged semiconductor die of claim 2, wherein the die substrate further comprises a conductive line penetrating the insulating substrate, and wherein the conductive line includes a first end and a second end that are electrically coupled to the first and second circuit pattern, respectively.

4. The packaged semiconductor die of claim 1, wherein the die substrate further comprises a first insulating layer and a second insulating layer stacked on the upper and lower surface of the insulating substrate, respectively, so as to define a first substrate pad and a second substrate pad by exposing portions of the first and second circuit pattern.

5. The packaged semiconductor die of claim 1, wherein a silicon substrate of the first semiconductor chip within the semiconductor package is exposed.

6. The packaged semiconductor die of claim 1, wherein the sealant seals the side surfaces of the semiconductor package, and a package mounting surface among the surfaces of the die substrate.

7. The packaged semiconductor die of claim 6, wherein a silicon substrate of the first semiconductor chip within the semiconductor package is exposed.

8. The packaged semiconductor die of claim 1, wherein the semiconductor package is a known good package that is selected from the group consisting of: a window ball grid array package and a ball grid array package.

9. The packaged semiconductor die of claim 1, wherein the known good package has passed a designated series of electrical and burn-in tests.

10. The packaged semiconductor die of claim 1, further comprising:
   a filler filled within a space between the die substrate and the semiconductor package.

11. The package semiconductor die of claim 1, further comprising:
   a second semiconductor chip disposed on the die substrate.

12. The package semiconductor die of claim 1, further comprising:
   a second semiconductor chip disposed on the semiconductor package.

13. A multi-chip package comprising:
   a substrate;
   a first semiconductor chip, wherein the first semiconductor chip is electrically coupled to the substrate; and
   a packaged semiconductor die including:
      a die substrate that includes an insulating substrate and a circuit pattern formed on the insulating substrate,
      a semiconductor package that includes a package substrate spaced apart from the die substrate and includes a second semiconductor chip disposed on the package substrate, wherein the second semiconductor chip is electrically coupled to the circuit pattern, wherein the semiconductor package is a known good package, and
      a first sealant sealing the semiconductor package
   wherein the first semiconductor chip and the packaged semiconductor die are stacked with each other on the substrate.

14. The multi-chip package of claim 13, wherein the first semiconductor chip is disposed between the substrate and the packaged semiconductor die.

15. The multi-chip package of claim 13, wherein the packaged semiconductor die is disposed between the substrate and the first semiconductor chip.

16. The multi-chip package of claim 13, further comprising:
   a second sealant sealing the packaged semiconductor die and the first semiconductor chip.

17. The multi-chip package of claim 13, wherein the insulating substrate includes an upper surface and a lower surface, and the circuit pattern comprises a first circuit pattern and a second circuit pattern formed on the upper and lower surfaces of the insulating substrate, respectively.

18. The multi-chip package of claim 13, wherein the sealant seals side surfaces of the semiconductor package and a package mounting surface among the surfaces of the die substrate.

19. The multi-chip package of claim 13, wherein the semiconductor package is a known good package that is selected from the group consisting of: a window ball grid array package and a ball grid array package.

20. The multi-chip package of claim 13, further comprising:
   a filler filled within a space between the die substrate and the semiconductor package.

* * * * *